(12) United States Patent
Greco et al.

(10) Patent No.: US 7,071,099 B1
(45) Date of Patent: Jul. 4, 2006

(54) FORMING OF LOCAL AND GLOBAL WIRING FOR SEMICONDUCTOR PRODUCT

(75) Inventors: Stephen E. Greco, LaGrangeville, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,623

(22) Filed: May 19, 2005

(51) Int. Cl.
   *H01L 21/4763* (2006.01)
(52) U.S. Cl. ............... 438/638; 438/626; 438/633; 257/752; 257/758; 257/E23.151
(58) Field of Classification Search ............. 438/626, 438/633, 638; 257/758, 752, E23.151
   See application file for complete search history.

(56) References Cited

U.S. PATENT DOCUMENTS

| | | | |
|---|---|---|---|
| 5,451,551 A * | 9/1995 | Krishnan et al. ........... 438/626 |
| 6,306,769 B1 | 10/2001 | Subramanian et al. | |
| 6,352,917 B1 | 3/2002 | Gupta et al. | |
| 6,555,467 B1 * | 4/2003 | Hsu et al. ................... 438/633 |
| 6,784,091 B1 | 8/2004 | Nuetzel et al. | |
| 6,888,251 B1 * | 5/2005 | Cooney et al. ............. 257/774 |
| 2002/0098673 A1 * | 7/2002 | Yeh et al. .................... 438/618 |
| 2003/0008493 A1 * | 1/2003 | Lee ............................. 438/626 |
| 2005/0227481 A1 * | 10/2005 | Brase et al. ................. 438/637 |
| 2005/0233519 A1 * | 10/2005 | Chang et al. ............... 438/253 |

FOREIGN PATENT DOCUMENTS

| JP | 2004228569 A | 1/2004 |
|---|---|---|
| WO | WO 02/103791 A2 | 12/2002 |

* cited by examiner

Primary Examiner—Matthew Smith
Assistant Examiner—John M. Parker
(74) Attorney, Agent, or Firm—Lisa U. Jaklitsch; Hoffman, Warnick & D'Alessandro, LLC

(57) ABSTRACT

Methods of forming different back-end-of-line (BEOL) wiring for different circuits on the same semiconductor product, i.e., wafer or chip, are disclosed. In one embodiment, the method includes simultaneously generating BEOL wiring over a first circuit using a dual damascene structure in a first dielectric layer, and BEOL wiring over a second circuit using a single damascene via structure in the first dielectric layer. Then, simultaneously generating BEOL wiring over the first circuit using a dual damascene structure in a second dielectric layer, and BEOL wiring over the second circuit using a single damascene line wire structure in the second dielectric layer. The single damascene via structure has a width approximately twice that of a via portion of the dual damascene structures and the single damascene line wire structure has a width approximately twice that of a line wire portion of the dual damascene structures. A semiconductor product having different width BEOL wiring for different circuits is also disclosed.

20 Claims, 5 Drawing Sheets

FIG. 1
PRIOR ART

| CMP | chip A or circuit A | chip B or circuit B |
|---|---|---|
| 1 | 1X | 1X |
| 2 | 1X | 1X |
| 3 | 1X | vertical wiring level |
| 4 | 1X | vertical wiring level |
| 5 | 1X | vertical wiring level |
| 6 | 1X | vertical wiring level |
| 7 | vertical wiring level | 2X |
| 8 | vertical wiring level | 2X |
| 9 | vertical wiring level | 2X |
| 10 | vertical wiring level | 2X |
| 11 | 4X | vertical wiring level |

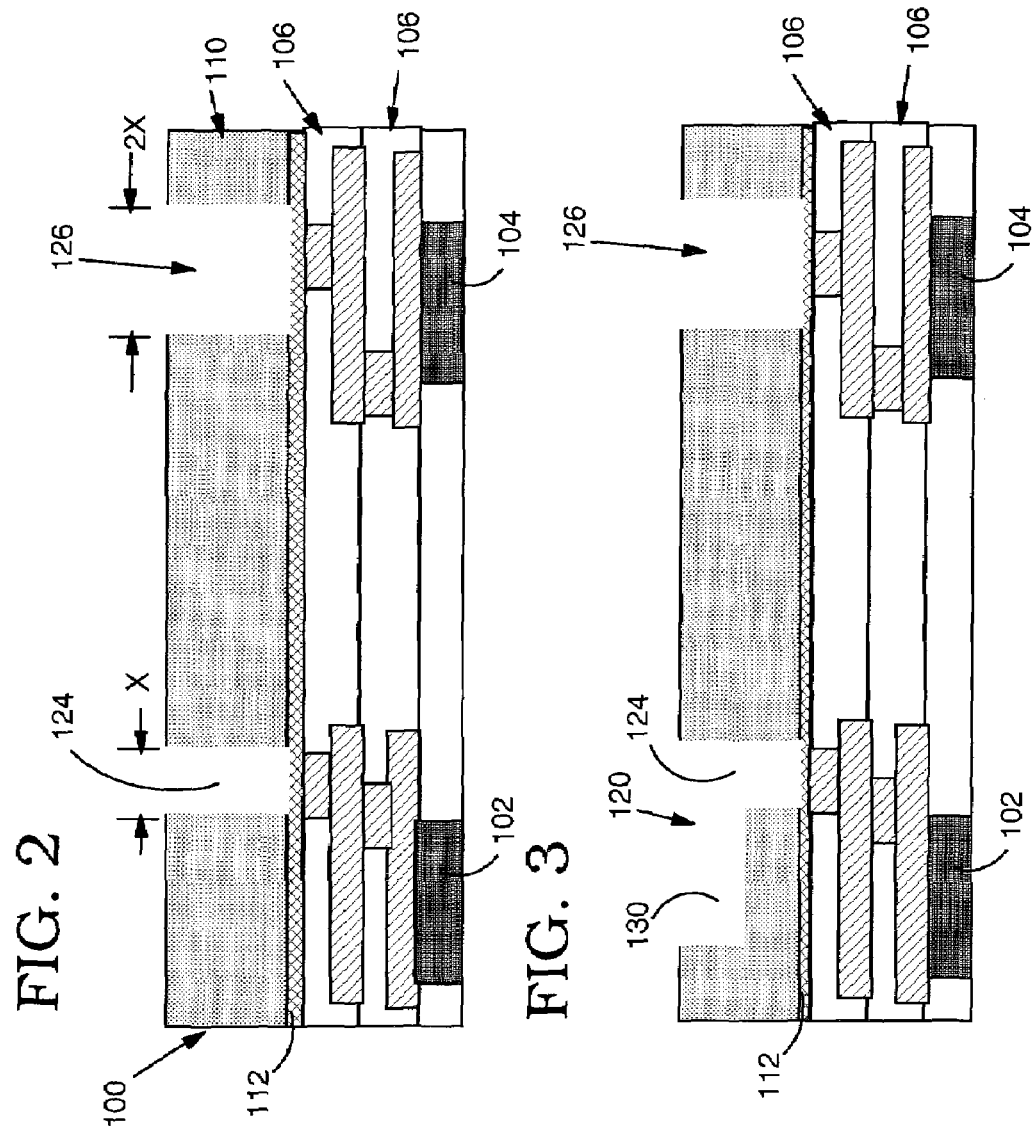

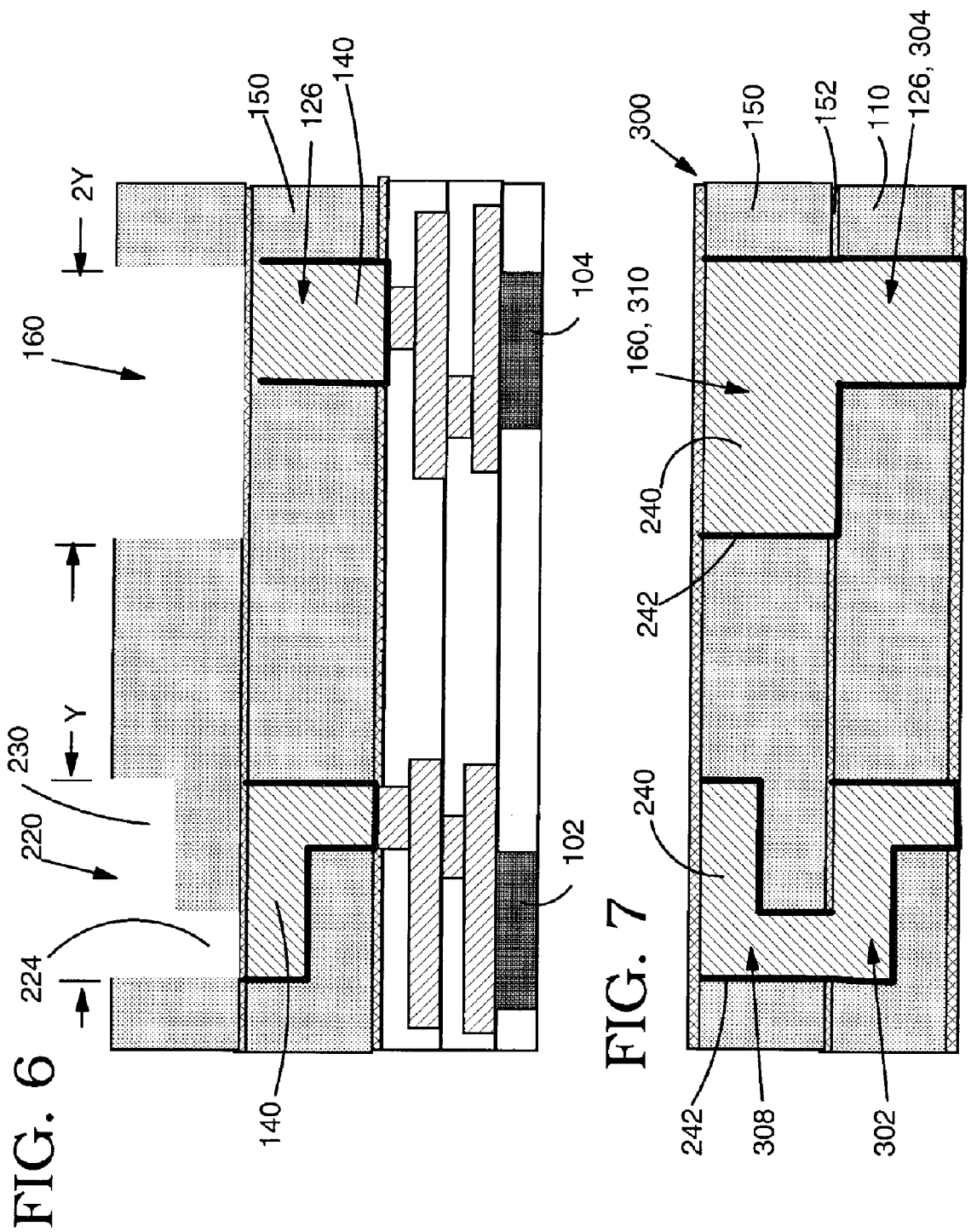

FIG. 8

| CMP | chip A or circuit A | chip B or circuit B |
|---|---|---|
| 1 | 1X | 1X |
| 2 | 1X | 1X |
| 3 | 1X | 2X |
| 4 | 1X | |
| 5 | 1X | 2X |
| 6 | 1X | |
| 7 | 4X | 2X |
| | | 2X |

FORMING OF LOCAL AND GLOBAL WIRING FOR SEMICONDUCTOR PRODUCT

BACKGROUND OF THE INVENTION

1. Technical Field

The present invention relates generally to semiconductor device fabrication, and more particularly, to methods of forming of local and global wiring for semiconductor product.

2. Related Art

During semiconductor device fabrication many different circuits can be formed on a single semiconductor product, i.e., chip or wafer. Each circuit may have different requirements for back-end-of-line (BEOL) wiring, which includes wiring levels for scaling up wiring from lower levels. To illustrate one conventional process, reference is made to FIG. 1, which includes a table of steps for two circuits (or chips) A, B having different BEOL wiring requirements. Circuit A is designed to include six 1X 'local wires' (or 'thinwires') plus one 4X 'global wire' (or 'fatwire'), and circuit B is designed to include two 1X local wires plus four 2X global wires and no 4X global wires. A 'local wire' is any wire that is substantially the same height and width as a first metal level wiring having a width X (hence, the 1X designation) and is sometimes referred to in the industry as a 'thinwire', and a "global wire" is any wire that is a multiple of the first metal level wiring greater than one, e.g., 2X, 4X, 8X, etc., and is sometimes referred to in the industry as a 'fatwire'. Accordingly, the 2X global wires are nominally twice the height and width of local wires, 4X global wires are nominally four times the height and width of local wires, and so on.

As shown in FIG. 1, the conventional way to put the two circuits A, B on the same semiconductor product would be to process a total of eleven dual damascene copper (also aluminum or other metals) levels, requiring 11 metal depositions and 11 chemical mechanical polishing (CMP) steps. Essentially, one must process the six local wires required by circuit A, followed by the four 2X global wires required by circuit B, followed by the one 4X global wire required by circuit A. In addition, after the first two local wires are completed, circuit B would require that the circuitry somehow be "carried up" through the remaining four local wire levels required by circuit A to connect to the first 2X global wire. If no redesign is to be done, then the "carry-up" would probably be done through a series of special (vertical wiring level) reticles with vias and small metal islands (i.e., vertical wiring). Vertical wiring level reticles would also be needed for use on circuit A while the 2X levels for circuit B are being built, and for use on circuit B while the 4X level for circuit A is being built.

Based on the above description, building two circuits (or chips) on the same wafer with different BEOL wiring is fairly cumbersome and expensive due to the complex processing involved. Besides cost-inefficiency, the vertical wiring increases resistance and capacitance because of the liner required for all of the different wiring.

In view of the foregoing, there is a need in the art for methods of forming different BEOL wiring for different circuits (or chips) on the same wafer in a more cost-efficient and performance-enhancing manner.

SUMMARY OF THE INVENTION

The invention includes methods of forming different back-end-of-line (BEOL) wiring for different circuits on the same semiconductor product, i.e., wafer or chip. In one embodiment, the method includes simultaneously generating BEOL wiring over a first circuit using a dual damascene structure in a first dielectric layer, and BEOL wiring over a second circuit using a single damascene via structure in the first dielectric layer. Then, simultaneously generating BEOL wiring over the first circuit using a dual damascene structure in a second dielectric layer, and BEOL wiring over the second circuit using a single damascene line wire structure in the second dielectric layer. The single damascene via structure has a width approximately twice that of a via portion of the dual damascene structures and the single damascene line wire structure has a width approximately twice that of a line wire portion of the dual damascene structures. The invention also includes a semiconductor product having different width BEOL wiring for different circuits.

A first aspect of the invention is directed to a method of forming different back-end-of-line (BEOL) wiring for different circuits on the same wafer, the method comprising the steps of: providing a structure including a first circuit and a second circuit and at least two metal wire levels thereover; forming, in a first BEOL dielectric layer, a first dual damascene structure over the first circuit having a via opening width while forming a single damascene via structure over the second circuit having a width approximately twice that of the via opening width; forming a metal in the first dual damascene structure and the single damascene via structure; depositing a second BEOL dielectric layer including a cap layer; forming, in the second BEOL dielectric layer, a second dual damascene structure in contact with the metal of the first dual damascene structure and over the first circuit having a line wire opening width while forming a single damascene line wire structure in contact with the metal of the single damascene via structures and over the second circuit, the single damascene line wire structure having a width approximately twice that of the first line wire opening width; and forming a metal in the second dual damascene structure and the single damascene line wire structure.

A second aspect of the invention includes a method of forming different back-end-of-line (BEOL) wiring for different circuits on the same wafer, the method comprising the steps of: simultaneously generating back-end-of-line (BEOL) wiring over a first circuit using a dual damascene structure in a first dielectric layer, and BEOL wiring over a second circuit using a single damascene via structure in the first dielectric layer; and simultaneously generating BEOL wiring over the first circuit using a dual damascene structure in a second dielectric layer, and BEOL wiring over the second circuit using a single damascene line wire structure in the second dielectric layer, wherein the single damascene via structure has a width approximately twice that of a via portion of the dual damascene structures and the single damascene line wire structure has a width approximately twice that of a line wire portion of the dual damascene structures.

A third aspect of the invention related to a semiconductor product comprising a first circuit and a second circuit, the product comprising: a first dual damascene metal structure in a first back-end-of-line (BEOL) dielectric layer over the first circuit, the first dual damascene metal structure having a via opening width; a single damascene metal via structure in the first BEOL dielectric layer and over the second circuit, the single damascene metal via structure having a width approximately twice that of the via opening width; a second dual damascene metal structure in a second BEOL dielectric layer over the first BEOL layer and over the first circuit, the second dual damascene metal structure having a line wire opening width; and a single damascene metal line wire structure connected to the single damascene metal via structure over the second circuit, the single damascene metal line wire structure having a width approximately twice that of the first line wire opening width.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIG. 1 shows a table illustrating steps of a conventional method.

FIGS. 2–7 show one embodiment of a method according to the invention.

FIG. 8 shows a table illustrating the steps of the method of FIGS. 2–7.

DETAILED DESCRIPTION

Figure 4:
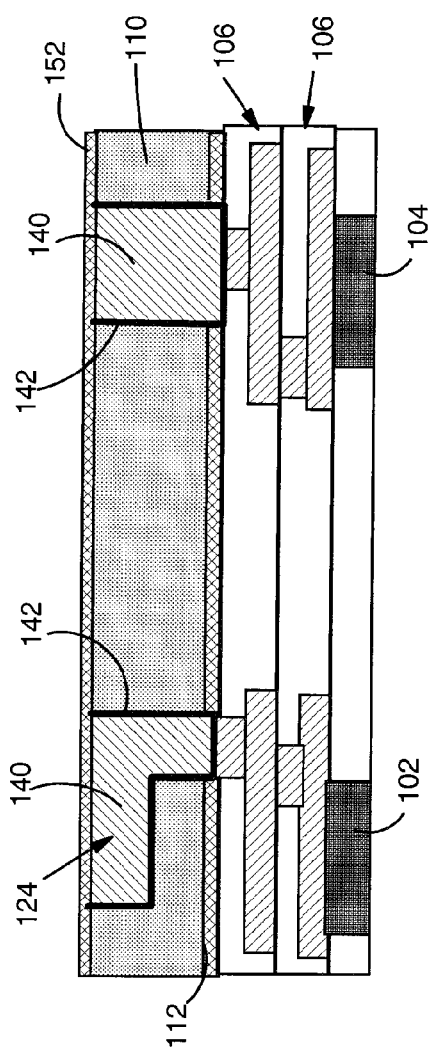

With reference to the accompanying drawings, FIGS. 2–7 illustrate one embodiment of a method of forming different back-end-of-line (BEOL) wiring for different circuits on the same wafer. As shown in FIG. 2, a first step includes providing a structure 100 including a first circuit 102 and a second circuit 104. At this point, both circuits 102, 104 have had the first two local wire metal levels 106 built. Structure 100 may represent a single chip including circuits 102, 104, or a wafer including circuits 102, 104 in the form of different chips. As used herein, "circuit" can mean any circuitry, and "semiconductor product" means either a semiconductor wafer or a chip. First circuit 102 and second circuit 104 have different requirements for BEOL wiring, i.e., wiring after at least two metal levels 106. A first BEOL dielectric layer 110 is also shown having a cap layer 112, e.g., silicon nitride ($Si_3N_4$), over metal levels 106.

FIGS. 2–3 show a next step of forming, in first BEOL dielectric layer 110, a first dual damascene structure 120 over first circuit 102 having a first via opening 124 width X (FIG. 2) while forming a single damascene via structure 126 over second circuit 104 having a width 2X (FIG. 2) approximately twice that of via opening 124 width X. This step may include forming first via opening 124 for first circuit 102 having first via opening width X while forming the single damascene via structure 126 for second circuit 104, and forming a first line wire opening 130 for first circuit 102 connected to first via opening 124 to complete first dual damascene structure 120. The opening forming steps may include any conventional processing such as depositing a resist, patterning and via reactive ion etching (RIE) of first BEOL dielectric layer 110. Other line wiring structure (not shown) may also be formed in first BEOL dielectric layer 112 with first line wire opening 130.

Turning to FIG. 4, a next step includes forming a metal 140 in first dual damascene structure 120 (FIG. 3) and single damascene via structure 126 (FIG. 3). This step may include conventional processing such as opening cap layer 112, depositing a liner 142, depositing metal 140 and planarizing metal 140, i.e., via chemical mechanical polishing (CMP).

Figure 5:
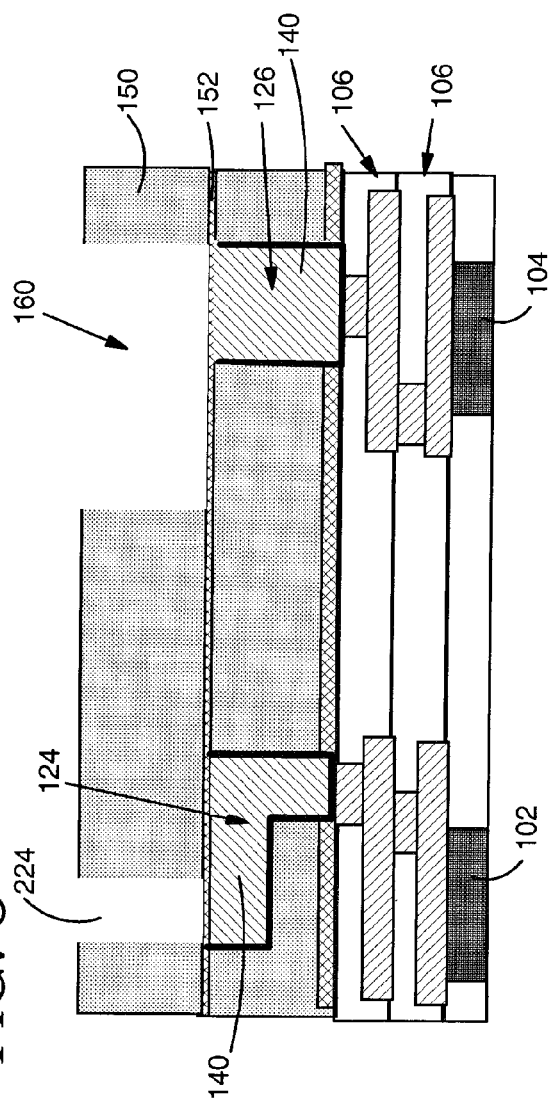

FIG. 5 shows a next step of depositing a second BEOL dielectric layer 150 including a cap layer 152 thereunder in any now known or later developed fashion.

FIGS. 5–6 show a next step of forming, in second BEOL dielectric layer 150, a second dual damascene structure 220 in contact with metal 140 of first dual damascene structure 124 and over first circuit 102 while forming a single damascene line wire structure 160 in contact with metal 140 of single damascene via structure 126 and over second circuit 104. This step may include forming a second via opening 224 for first circuit 102 while forming single damascene line wire opening 160 for second circuit 104, as shown in FIG. 5, and then forming a second line wire opening 230 for first circuit 102 connected to second via opening 230 to complete second dual damascene structure 220. Other line wiring structure (not shown) may also be formed in second BEOL dielectric layer 150 with second line wire opening 230. As shown in FIG. 6, single damascene line wire structure 160 has a width 2Y approximately twice that of first line wire opening 230 width Y. It should also be recognized that a width of the single damascene wire could be wider than 2Y, and a width of first line wiring opening 230 could be wider than width Y. More specifically, ground rules typically permit large distributions of wire width. Accordingly, width Y and width 2Y would be the minimum widths for these two types of wires, one being approximately twice as tall as the other.

FIG. 7 shows a last step of the method including forming a metal 240 in second dual damascene structure 220 and single damascene line wire structure 160. This step may include conventional processing such as opening cap layer 152, depositing a liner 242, depositing the metal 240 and planarizing the metal, i.e., via chemical mechanical polishing (CMP).

It should be recognized that the widths of structures formed may vary. For example, the above described embodiment employs a via opening 124 width X and line wire opening 230 width Y that correspond to a width of a first metal level 106 wiring X, Y. However, via opening 124 width and line wire opening 230 width may correspond to approximately twice a width of first metal level 106 wiring, i.e., 2X, 2Y. Thus, single damascene structures 126, 160 may have widths 4X, 4Y. Furthermore, via opening 124 width and line wire opening 230 width may correspond to four times a width of first metal level 106 wiring, i.e., 4X, 4Y. Thus, single damascene structures 126, 160 may have widths 8X, 8Y.

The above-described methodology may also be repeated for subsequent layers.

The invention also includes a method of forming different BEOL wiring for different circuits on the same wafer including: simultaneously generating back-end-of-line (BEOL) wiring over a first circuit using a dual damascene structure in a first dielectric layer, and BEOL wiring over a second circuit using a single damascene via structure in the first dielectric layer; and simultaneously generating BEOL wiring over the first circuit using a dual damascene structure in a second dielectric layer, and BEOL wiring over the second circuit using a single damascene line wire structure in the second dielectric layer. The single damascene via structure has a width approximately twice that of a via portion of the dual damascene structures and the single damascene line wire structure has a width approximately twice that of a line wire portion of the dual damascene structures.

As shown in FIG. 7, the invention also includes a semiconductor product 300 comprising first circuit 102 and second circuit 104, a first dual damascene metal structure 302 in first BEOL dielectric layer 110 over first circuit 102, and a single damascene metal via structure 304 in first BEOL dielectric layer 110 and over second circuit 102. Single damascene metal via structure 306 has a width (2X) approximately twice that of via opening 124 width X (FIG. 2). Product 300 also includes a second dual damascene metal structure 308 in second BEOL dielectric layer 150 over first BEOL layer 112 and over first circuit 104. Second dual damascene metal structure 308 has a line wire opening 230 width Y (FIG. 6). Product 300 also includes a single damascene metal line wire structure 310 connected to single damascene metal via structure 306 over second circuit 104. Single damascene metal line wire structure 310 has a width (2Y) approximately twice that of first line wire opening 230 width (Y) (FIG. 6).

As described above, in terms of width, a line wire portion 130, 230 of each dual damascene metal structure 302, 308 has a width Y corresponding to that of a first metal level wiring. Alternatively, a line wire portion 130, 230 of each dual damascene metal structure 302, 308 may have a width corresponding to approximately twice that of a first metal level wiring. Thus, single damascene metal structures 304, 310 may have widths 4X, 4Y. Furthermore, a line wire portion 130, 230 of each dual damascene metal structure 302, 308 may have a width corresponding to four times that of a first metal level wiring. Thus, single damascene metal structures 304, 320 may have widths 8X, 8Y.

FIG. 8 shows a table illustrating the steps of the method of FIGS. 2–7. FIG. 8 illustrates a how the number of CMP steps is reduced from 11 (as shown in FIGS. 1–7), using the above-described method. It should be emphasized that the above-described steps and structure are illustrative only, and it is possible to use the invention for other structural combinations. Also, in an analogous fashion, the process can be done with "line first" integration schemes.

In addition to allowing two circuits with different requirements to be put on the same wafer in a cost effective manner, the invention can increase wiring efficiency in a single chip by allowing different circuits in the same chip to be wired in different manners. For instance, it might be advantageous for a particular circuit to utilize four local wires (1X) before going to global wires, while another circuit would be more efficient by going to a 2X global wire after only two local wires. This situation is more likely since metal lines are becoming increasingly resistive with each new technology because of the reduced dimensions, and in some cases it becomes important, after local wiring is completed, to route lower resistance paths as soon as possible. The conventional solution for the circuit which needs only two local wires would be to "carry up" the signals through the two remaining local wire levels through 1X vias and 1X lines or islands, but this conventional technique adds resistance to circuits (which can harm performance), uses up wiring tracks (which can harm density and possibly even drive a requirement for more metal levels) and moves the global wires further away from the silicon (which can be disadvantageous for heat dissipation). The above-described method eliminates these issues.

It should also be noted that the same 2X wiring pattern for second circuit 104 could have been built, at the same cost as the above-described method and using the same reticles, in two 1X thickness wires instead of one 2X thickness wire. In this case, single damascene metal structure 310 (FIG. 7) could have been split into two half height wires (both having width equal to the 2X thickness wire), with one running directly on top of the other, connected with large vias on top of one another by using the via reticle twice and the line reticle twice (both the vias and lines in this case have 2X width but 1X height). Relative to this situation, however, modeling predicts (for 2X fatwiring at dimensions appropriate for 45 nm technologies) an advantage is provided by the above-described embodiments in both resistance (because the structure produced has less liner volume fraction) and total capacitance. Specifically, one line of 2X height has less liner volume fraction than two lines of 1X height (all three lines being equal in width), leading to a lower resistance for the 2X line versus the parallel resistance of the pair of 1X lines, because metallic liners (tantalum, tungsten, etc.) generally have much higher resistance than the metals used to fill the lines (copper, aluminum, etc.).

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming different back-end-of-line (BEOL) wiring for different circuits on the same wafer, the method comprising the steps of:
   providing a structure including a first circuit and a second circuit and at least two metal wire levels thereover;
   forming, in a first BEOL dielectric layer, a first dual damascene structure over the first circuit having a via opening width while forming a single damascene via structure over the second circuit having a width approximately twice that of the via opening width;
   forming a metal in the first dual damascene structure and the single damascene via structure;
   depositing a second BEOL dielectric layer including a cap layer;
   forming, in the second BEOL dielectric layer, a second dual damascene structure in contact with the metal of the first dual damascene structure and over the first circuit having a line wire opening width while forming a single damascene line wire structure in contact with the metal of the single damascene via structures and over the second circuit, the single damascene line wire structure having a width approximately twice that of the first line wire opening width; and
   forming a metal in the second dual damascene structure and the single damascene line wire structure.

2. The method of claim 1, wherein the first dual damascene structure and single damascene via structure forming step includes:
   forming a first via opening for the first circuit having the via opening width while forming the single damascene via structure for the second circuit; and
   forming a first line wire opening for the first circuit connected to the first via opening to complete the first dual damascene structure.

3. The method of claim 1, wherein the second dual damascene structure and the single damascene line wire structure forming step includes:
   forming a second via opening for the first circuit while forming the single damascene line wire opening for the second circuit; and
   forming a second line wire opening for the first circuit connected to the second via opening to complete the second dual damascene structure.

4. The method of claim 1, wherein each metal forming step includes:
   opening the cap layer;
   depositing a liner;
   depositing the metal; and
   planarizing the metal.

5. The method of claim 1, wherein the via opening width and the line wire opening width correspond to a width of a first metal level wiring.

6. The method of claim 1, wherein the via opening width and the line wire opening width correspond to approximately twice a width of a first metal level wiring.

7. The method of claim 1, wherein the via opening width and the line wire opening width correspond to four times a width of a first metal level wiring.

8. The method of claim 1, further comprising the steps of repeating the method for subsequent layers.

9. A method of forming different back-end-of-line (BEOL) wiring for different circuits on the same wafer, the method comprising the steps of:
- simultaneously generating back-end-of-line (BEOL) wiring over a first circuit using a dual damascene structure in a first dielectric layer, and BEOL wiring over a second circuit using a single damascene via structure in the first dielectric layer; and
- simultaneously generating BEOL wiring over the first circuit using a dual damascene structure in a second dielectric layer, and BEOL wiring over the second circuit using a single damascene line wire structure in the second dielectric layer,
- wherein the single damascene via structure has a width approximately twice that of a via portion of the dual damascene structures and the single damascene line wire structure has a width approximately twice that of a line wire portion of the dual damascene structures.

10. The method of claim 9, wherein each generating step includes:
- opening the damascene structures;
- opening a cap layer over each dielectric layer;
- depositing a liner;
- depositing a metal; and
- planarizing the metal.

11. The method of claim 9, wherein a line wire portion of each dual damascene structure has a width corresponding to that of a first metal level wiring.

12. The method of claim 9, wherein a line wire portion of each dual damascene structure has a width corresponding to approximately twice that of a first metal level wiring.

13. The method of claim 9, wherein a line wire portion of each dual damascene structure has a width corresponding to four times that of a first metal level wiring.

14. The method of claim 9, further comprising the steps of repeating the method for subsequent layers.

15. A semiconductor product comprising a first circuit and a second circuit, the product comprising:
- a first dual damascene metal structure in a first back-end-of-line (BEOL) dielectric layer over the first circuit, the first dual damascene metal structure having a via opening width;
- a single damascene metal via structure in the first BEOL dielectric layer and over the second circuit, the single damascene metal via structure having a width approximately twice that of the via opening width;
- a second dual damascene metal structure in a second BEOL dielectric layer over the first BEOL layer and over the first circuit, the second dual damascene metal structure having a line wire opening width; and
- a single damascene metal line wire structure connected to the single damascene metal via structure over the second circuit, the single damascene metal line wire structure having a width approximately twice that of the first line wire opening width.

16. The product of claim 15, wherein a line wire portion of each dual damascene metal structure has a width corresponding to that of a first metal level wiring.

17. The product of claim 15, wherein a line wire portion of each dual damascene metal structure has a width corresponding to approximately twice that of a first metal level wiring.

18. The product of claim 15, wherein a line wire portion of each dual damascene metal structure has a width corresponding to four times that of a first metal level wiring.

19. The product of claim 15, wherein the first BEOL dielectric layer is positioned above at least two metal levels.

20. The product of claim 15, further comprising a cap layer between the first and second BEOL dielectric layers.

* * * * *